United States Patent [19]

Komatsu et al.

[11] Patent Number: 5,359,197
[45] Date of Patent: Oct. 25, 1994

[54] APPARATUS AND METHOD OF ALIGNING ELECTRON BEAM OF SCANNING ELECTRON MICROSCOPE

[75] Inventors: Fumio Komatsu, Fuchu; Motosuke Miyoshi, Minato, both of Japan

[73] Assignee: Kabushiki Kaisha Toshiba, Kawasaki, Japan

[21] Appl. No.: 92,466

[22] Filed: Jul. 16, 1993

[30] Foreign Application Priority Data

Jul. 16, 1992 [JP] Japan .................................. 4-212014

[51] Int. Cl.$^5$ ............................................ G01N 23/225
[52] U.S. Cl. ....................................... 250/310; 250/307
[58] Field of Search ....................... 250/310, 307, 311

[56] References Cited

U.S. PATENT DOCUMENTS 4,618,766 10/1986 van der Mast et al. ............ 250/311
4,663,525 5/1987 Ohtsuki et al. ..................... 250/307
5,144,129 9/1992 Kobayashi et al. ................. 250/310

*Primary Examiner*—Jack I. Berman
*Attorney, Agent, or Firm*—Foley & Lardner

[57] ABSTRACT

In a gun (or lens) alignment control apparatus for an scanning electron microscope, a condenser (or objective) lens is controllably set to first and second conditions, respectively; first and second filament (or secondary electron) images obtained under the first and second conditions are inputted, respectively; the first and second filament (or secondary electron) images are processed to obtain first and second binarized images, respectively; the first and second binarized images are further processed to obtain first and second histograms, respectively; first and second coordinates at which the first and second histograms become maximum in frequency are detected, respectively; and exciting current for a gun (or lens) alignment coil is controlled so that the two coordinates match each other. Since the excitation of the gun (or lens) alignment coil can be controlled automatically so that the filament (or secondary electron) image obtained by the scanning electron microscope will not be shifted, the alignment error can be reduced and thereby an excellent image can be obtained.

32 Claims, 4 Drawing Sheets

REDUCTION RATIO = 0.03

REDUCTION RATIO = 0.06

APPARATUS AND METHOD OF ALIGNING ELECTRON BEAM OF SCANNING ELECTRON MICROSCOPE

FIELD OF THE INVENTION

The present invention relates to an apparatus and method of aligning an electron beam of an scanning electron microscope, and more specifically to an alignment apparatus and method for an electron beam such as gun alignment and lens alignment of an electron optical system of an scanning electron microscope.

BACKGROUND OF THE INVENTION

In general, a table look-up method is well known as a method of automatically setting a beam alignment of an electron optical system (referred to as EOS, hereinafter) of an scanning electron microscope. In this method, optimum parameter values of the EOS are previously registered for each constant acceleration voltage, and the EOS parameters corresponding to an acceleration voltage to be set are calculated and interpolated on the basis of the registered data. In addition, an alignment method using a Faraday cup is adopted as an automatic control method. In this method, the irradiation current is read by use of a Faraday cup, and an exciting current for controlling an alignment coil is determined under closed loop control so that the irradiation current value can be maximized. In this case, an initial excitation current passed through the alignment coil is determined by interpolating the values obtained in accordance with a table look-up method.

In the above-mentioned table look-up method, however, a data file of optimum parameter data to be previously registered must be updated according to the EOS conditions. In more detail, whenever an electron gun or a movable aperture of the electron optical system is exchanged, the data file must be updated. Further, it is also necessary to update the data file according to the lapse of time. In addition, when the beam alignment is effected according to any given acceleration voltage, interpolation calculations are required, with the result that the number of optimum parameter data increases with increasing range in which the acceleration voltage is to be set. For instance, when a voltage range between 0.5 and 2.0 kV is interpolated at 100 V intervals, 16 optimum parameter data files of 100 V steps must be prepared in total. Otherwise, there exists a problem in that the alignment discrepancy from manual operation increases.

In the case of the gun alignment method of using a Faraday cup, the tilt correction is effected by obtaining the maximum value of the beam current. However, the shift correction must be effected by determining the quality of the obtained secondary electron image (for instance, by observing the change in contrast on the image), in addition to the beam current. In the case of the lens alignment method of using the Faraday cup, on the other hand, it is required to find the maximum beam current conditions by setting the Faraday cup at the sample position. In this case, however, since the sensitivity of change in the beam current is low relative to the change in excitation of a lens alignment coil, although it is possible to obtain a maximum beam current on the basis of the determined alignment coil excitation value, there exists a case where the obtained excitation value will not match the optimum alignment condition.

In summary, in the conventional electron beam alignment methods, it has been so far difficult to reduce the alignment error automatically.

SUMMARY OF THE INVENTION

With these problems in mind, therefore, the object of the present invention is to provide an apparatus and method of controlling gun or lens alignment for an scanning electron microscope, which can reduce the alignment error.

To achieve the above-mentioned object, the first aspect of the present invention provides a gun alignment control apparatus for an scanning electron microscope, comprising: first control means for controllably setting either one of a condenser lens and a scan coil to first and second conditions, respectively; image inputting means for inputting first and second filament images obtained under the first and second conditions, respectively; image processing means for processing the first and second filament images to obtain first and second binarized images, respectively; histogram processing means for processing the first and second binarized images to obtain first and second histograms, respectively; coordinate detecting means for detecting first and second coordinates at which the first and second histograms become maximum in frequency, respectively; and gun alignment coil control means for controlling exciting current for a gun alignment coil so that the two coordinates match each other.

Further, the second aspect of the present invention provides a lens alignment control apparatus for an scanning electron microscope, comprising: objective lens control means for controllably setting a objective lens to first and second conditions, respectively; image inputting means for inputting first and second secondary electron images obtained under the first and second conditions, respectively; image processing means for processing the first and secondary electron images to obtain first and second binarized images, respectively; histogram processing means for processing the first and second binarized images to obtain first and second histograms, respectively; coordinate detecting means for detecting first and second coordinates at which the first and second histograms become maximum in frequency, respectively; and lens alignment coil control means for controlling exciting current for a lens alignment coil so that the two coordinates match each other.

Further, the present invention provides a gun alignment control method for an scanning electron microscope, comprising the steps of: controllably setting a condenser lens to first and second conditions, respectively; inputting first and second filament images obtained under the first and second conditions, respectively; processing the first and second filament images to obtain first and second binarized images, respectively; processing the first and second binarized images to obtain first and second histograms, respectively; detecting first and second coordinates at which the first and second histograms become maximum in frequency, respectively; and controlling exciting current for a gun alignment coil so that the two coordinates match each other.

Further, the present invention provides a lens alignment control method for an scanning electron microscope, comprising the steps of: controllably setting an objective lens to first and second conditions, respectively; inputting first and second secondary electron images obtained under the first and second conditions, respectively; processing the first and second secondary electron images to obtain first and second binarized images, respectively; processing the first and second binarized images to obtain first and second histograms, respectively; detecting first and second coordinates at which the first and second histograms become maximum in frequency, respectively; and controlling exciting current for a lens alignment coil so that the two coordinates match each other.

An original image of an scanning electron microscope is inputted to an image processing section. The inputted original image data are binarized. The binarized image data are processed for histogram formation. The coordinates at which the histogram frequency becomes the maximum in both the X- and Y-axis directions are obtained. The scanning magnification of the scanning coil is set to two different conditions. The gun alignment coil or the lens alignment coil is excited in such a way that the above-mentioned coordinates will not change in the respective filament images obtained at the scanning coil magnifications of two different conditions.

As described above, in the apparatus and the method of the present invention, it is possible to control the electron beam automatically without shifting the filament image or the secondary electron image.

DETAILED DESCRIPTION OF THE PREFERRED EMBODIMENTS

Figure 1:
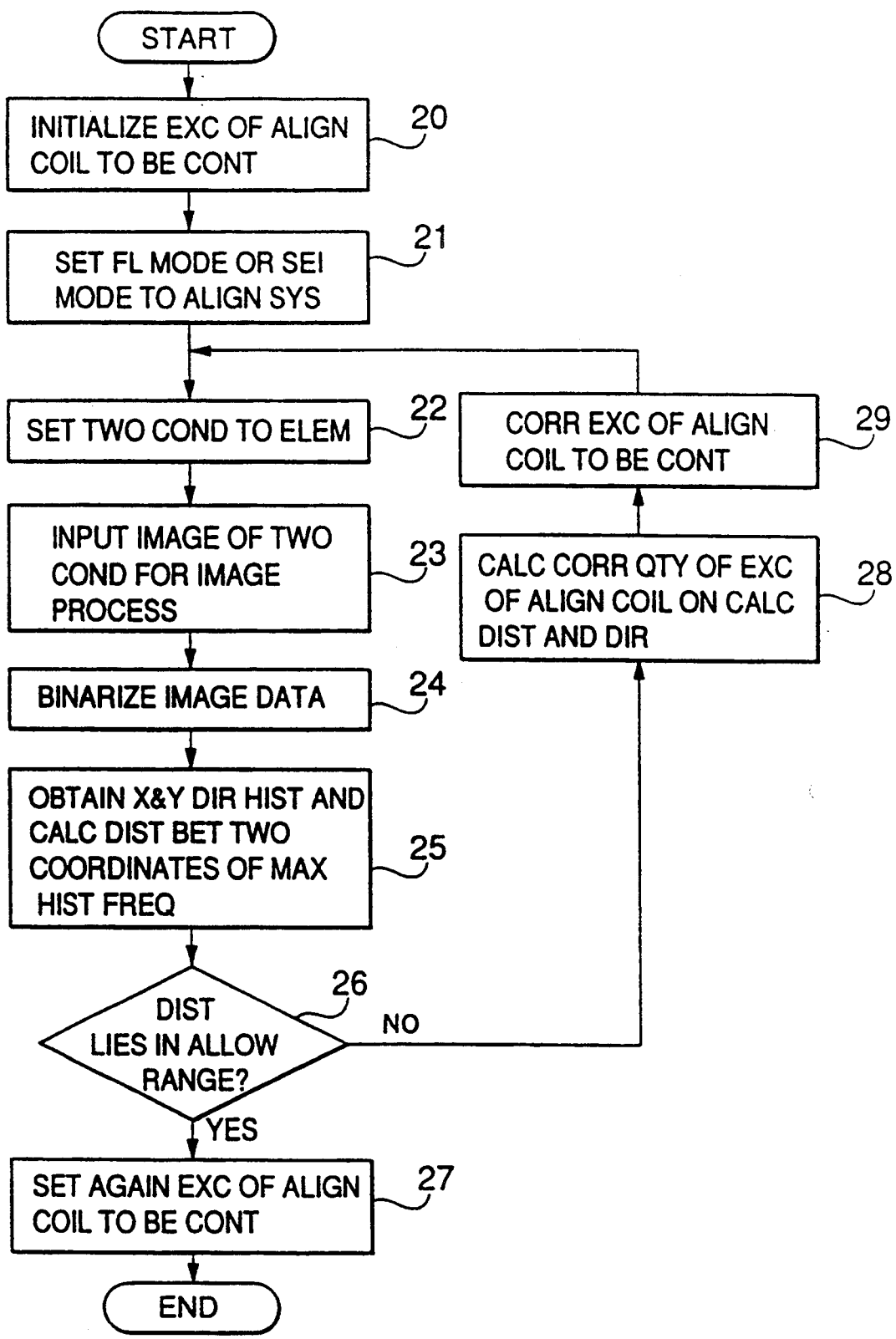
FIG. 1 is a flowchart for assistance in explaining one embodiment of the present invention.
Figure 2:
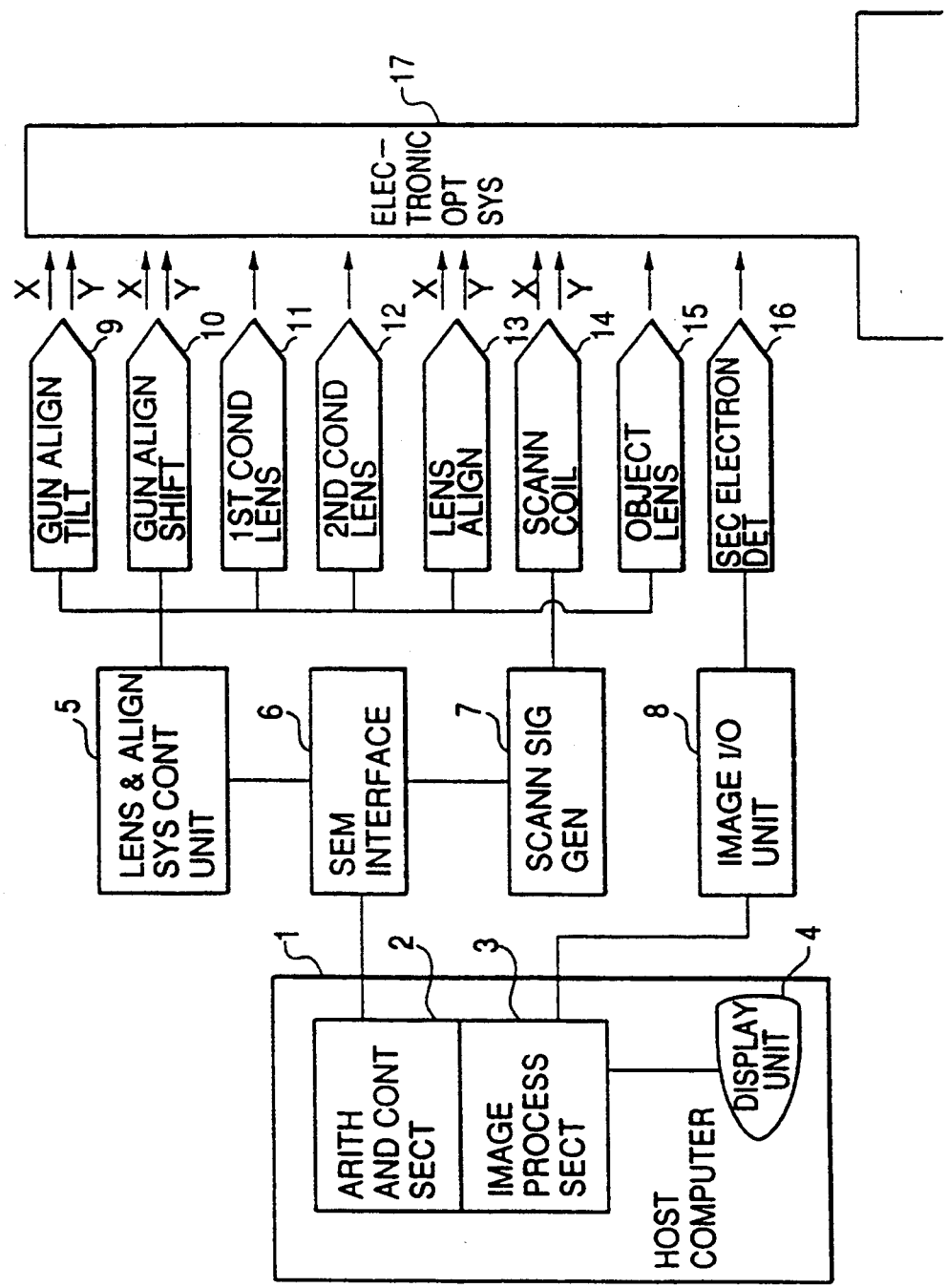
FIG. 2 is a schematic block diagram showing an scanning electron microscope operated by executing the flowchart shown in FIG. 1.

FIG. 1 is a flowchart for assistance in explaining an electron beam alignment method related to one embodiment of the present invention. FIG. 2 is a schematic block diagram showing an scanning electron microscope to which the electron beam alignment method according to the present invention shown in FIG. 1 is applied.

In FIG. 2, an electron optical system 17 is provided with a gun alignment tilt section 9, a gun alignment shift section 10, a first condenser lens section 11, a second condenser lens section 12, a lens alignment section 13, a scanning coil section 14, and an objective lens section 15. The respective sections 9 to 13 and 15 are all controlled by a lens system and alignment system control unit 5. Further, the scanning coil section 14 is controlled by a scanning signal generator 7. An obtained image is detected by a secondary electron detecting section 16, and then inputted to a host computer via an image input/output unit 8. The lens system and alignment system control unit 5 and the scanning signal generating section 7 are both connected to the host computer 1 via a SEM interface 6. The host computer 1 is composed of an arithmetic and control section 2, an image processing section 3, and a display section 4. Further, the gun alignment tilt section 9, the gun alignment shift section 10 and the lens alignment section 13 include an alignment coil used for adjustments of X- and Y-direction alignments of the electron optical system 17, respectively. Further, the first condenser lens section 11, the second condenser lens section 12 and the objective lens section 15 include a coil for adjustments of demagnification, magnification, in-focus condition, out-of-focus condition, etc.

With reference to FIG. 2, the flowchart shown in FIG. 1 will be described hereinbelow.

First, in step 20, the arithmetic and control section 2 of the host computer 1 initializes the excitation of the alignment coils to be controlled, respectively via the SEM interface 6 and the lens system and alignment system control unit 5. The respective initial values can be obtained by the following expression:

$$x(v) = x(1.0) \times V^{\frac{1}{2}}$$

where x (v) denotes the initial value; x (1.0) denotes an excitation value of when the acceleration voltage is 1.0 Kv; and V denotes an acceleration voltage. Further, the alignment coils to be controlled are those included in the gun alignment tilt section 9, the gun alignment shift section 10 and the lens alignment section 13, respectively.

In the succeeding step 21, if the element to be controlled is a gun alignment coil, the control mode is set to a filament image (FI) mode. If the element to be controlled is a lens alignment coil, the control mode is set to a secondary electron image (SEI) mode.

In step 22, the objective element to be controlled is set to two different conditions. In the case of the gun alignment tilt section 9, the objective element is the first condenser lens section 11 or the second condenser lens section 12. In the case of the gun alignment shift section 10, the objective element is the scanning coil section 14. In the case of the lens alignment section 13, the objective element is the objective lens 15, respectively. For each objective element, two condition values are set, and the images obtained under these two different conditions are outputted. For instance, in the case of the gun alignment tilt section 9, the reduction ratio (minification) is set to two difference values. In the case of the gun alignment shift section 10, the magnification is set to two different values. In the case of the lens alignment section 13, the focus condition is changed to in-focus and out-of-focus conditions, respectively.

In step 23, the images obtained under two different conditions are inputted to the image processing section 3 of the host computer 1 via the secondary electron detecting section 16 and the image input/output unit 8. The inputted image data are stored in a frame memory (not shown) as multi-value image data of 256 gradations, for instance.

In step 24, each pixel of the image data is processed for binarization.

In step 25, histograms with respect to both X- and Y-axis directions are formed on the basis of the binarized image data, respectively. Further, the two coordinates (P(x1), P(y1)) and (P(x2), P(y2)) at which the histogram values (the histogram frequencies) in the X- and Y-axis directions become maximum are obtained for the two images obtained under two different conditions. These two coordinates are determined according to the number of pixels from the origin. Further, the distance d between these two coordinates are calculated as follows:

$$\{(P(x1) - P(x2))^2 + (P(y1) - P(y2))^2\}^{\frac{1}{2}}$$

In step 26, the arithmetic and control section 3 checks whether the calculated distance d lies within an allowable range.

If the distance d lies within the allowable range, in step 27, the current excitation value of the alignment coil is set again as the final convergent value.

On the other hand, if the distance d lies out of the allowable range, in step 28, an excitation correction value X' in the X-axis direction is obtained as follows:

$$X' = X(c) + (P(x1) - P(x2)) \times M \times C(x)$$

where $X(c)$ (V) denotes the current excitation value of the alignment coil in the X-axis direction; M denotes the dimension conversion coefficient for each pixel; and $C(x)$ (V/μm) denotes the sensitivity of the alignment coil.

Similarly, an excitation correction value Y' in the Y-axis direction can be obtained.

In step 29, on the basis of the calculated results, the excitation of the alignment coil to be controlled is corrected. The above-mentioned procedure is repeated for each objective element, beginning from the step 22.

As described above, the arithmetic and control section 2 of the host computer 1 controls the lens system and alignment system control unit 5 or the scanning signal generating section 7 sequentially via the SEM interface 6, so as to execute the beam alignment. At the same time, the image processing section 3 of the host computer 1 inputs image (video) data through the image input/output unit 8, processes the inputted image data (binarization, histogram formation, etc.) to obtain quantitative offset value of the beam alignment, and then transfers the obtained value to the arithmetic and control section 2 in real time. Accordingly, it is possible to effectively execute the automatic control the focus adjustment, the astigmatism correction, etc. of the electron optical system 17, as well as the beam alignment.

Figure 3A:
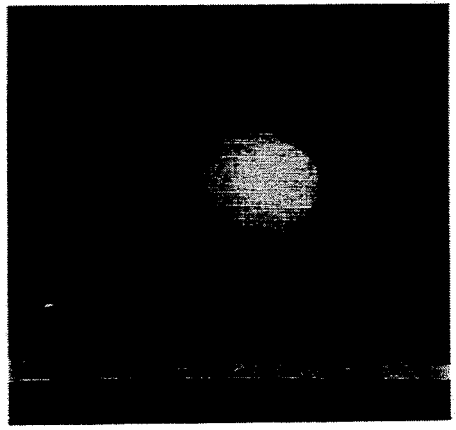
FIGS. 3(a) to (f) are photographs for assistance in explaining the automatic control of the gun alignment tilt.
Figure 3D:
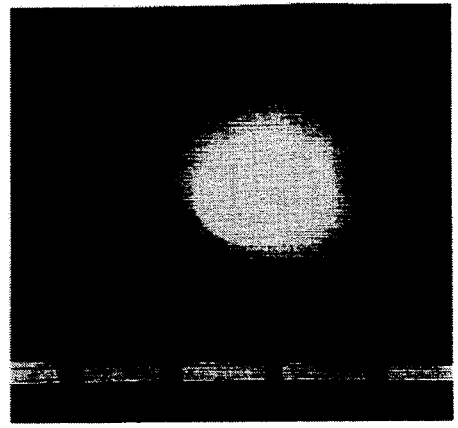
Figure 3B:
Figure 3D:
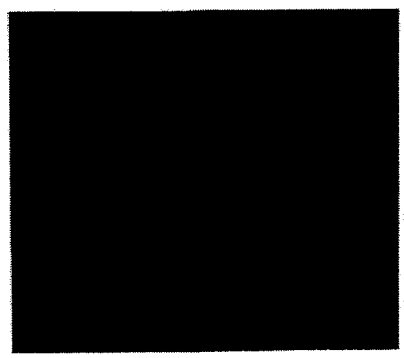
Figure 3E:
Figure 3D:
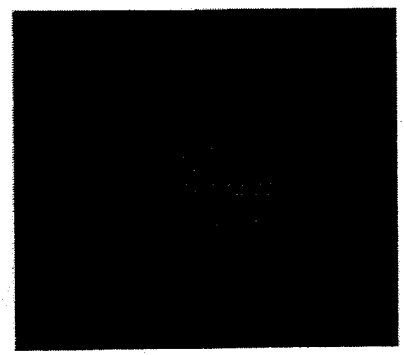
Figure 3C:
Figure 3D:
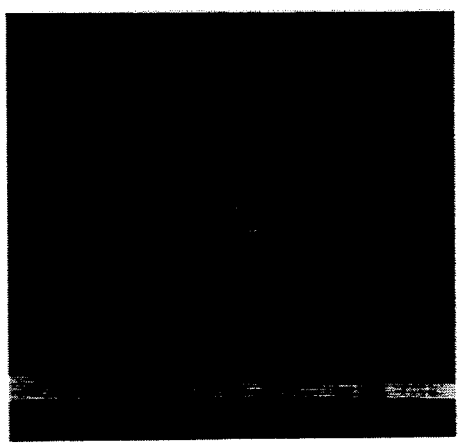
Figure 3F:
Figure 3D:
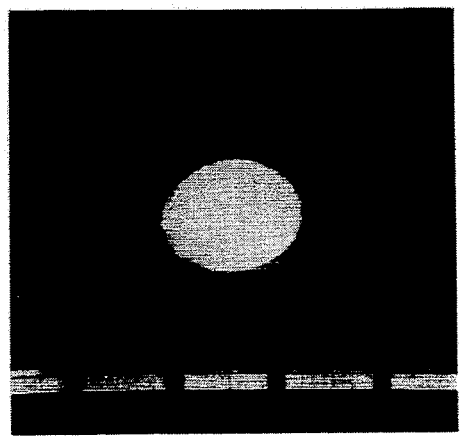

An actual example of automatic control of the gun alignment will be described hereinbelow with reference to FIGS. 3(a) to (f). FIGS. 3(a) and (d) show a filament image obtained when the reduction ratio of the condenser lens is 0.03 and 0.06, respectively. In both the cases, the magnification is ×300. FIGS. 3(b) and (e) show the same image obtained when the image data obtained under two different conditions are processed for binarization, respectively. In FIGS. 3(b) and (e), a mark near the central portion of the image indicates the coordinates at which the histogram frequency becomes the maximum in both the X- and Y-axis directions when the binarized image data are processed for histogram formation, respectively. These photographs indicate that when the reduction ratio is changed, the coordinates at which the histogram frequency becomes the maximum in both the X- and Y-axis directions are shifted in the positive X-axis direction. Therefore, the gun alignment must be corrected in the negative X-axis direction by the gun alignment tilt section 9. FIGS. 3(c) and (f) show the corrected result, respectively. These photographs indicate that even if the reduction ratio is changed, the coordinates at which the histogram frequency becomes the maximum in both the directions will not change, with the result that it is possible to confirm that the tilt correction can be executed normally.

Figure 4A:
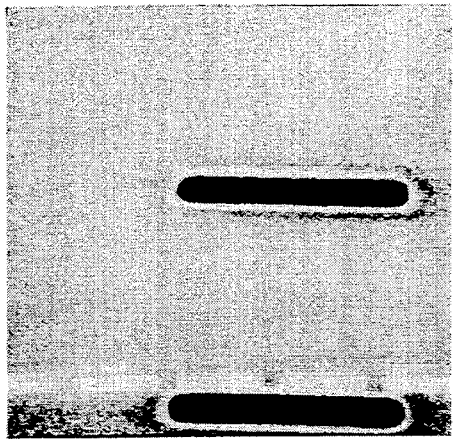
FIGS. 4(a) to (f) are photographs for assistance in explaining the automatic control of the lens alignment.
Figure 4D:
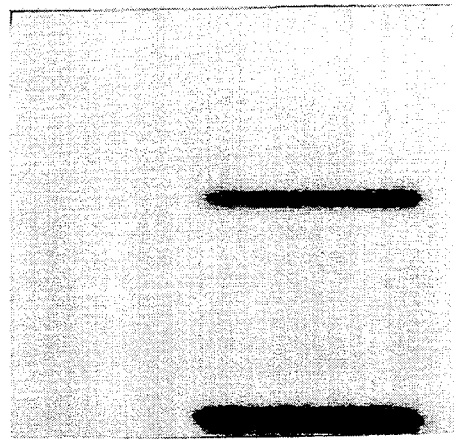
Figure 4B:
Figure 4D:
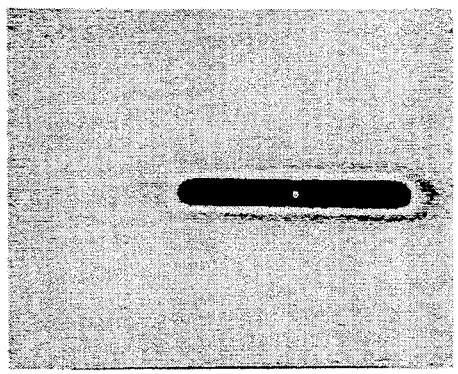
Figure 4E:
Figure 4D:
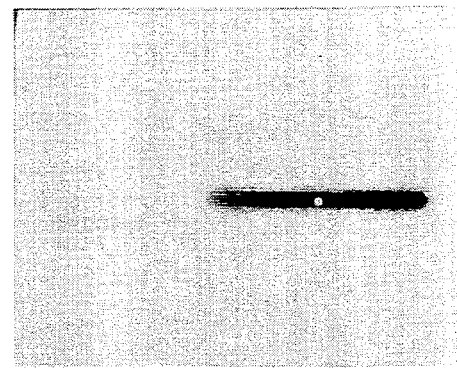
Figure 4C:
Figure 4D:
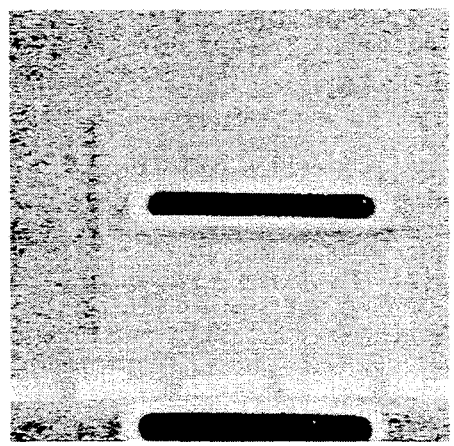
Figure 4F:
Figure 4D:
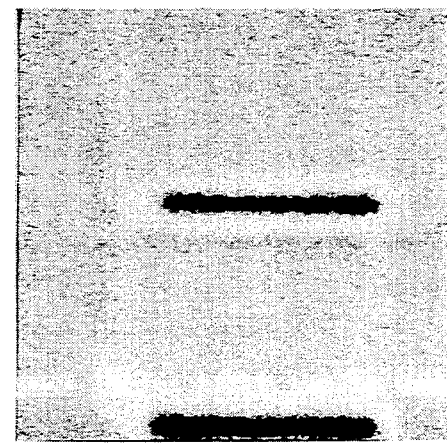

An actual example of automatic control of the lens alignment (tilt) will be described hereinbelow with reference to FIGS. 4(a) to (f). FIGS. 4(a) and (d) show a secondary electron image obtained when the focus is in-focus and out-of-focus, respectively. In both the cases, the magnification is ×15,000. FIGS. 4(b) and (e) show the same secondary electron image obtained when the image data obtained under two different conditions are processed for binarization, respectively. In FIGS. 4(b) and (e), a mark near the central portion of the image indicates the coordinates at which the histogram frequency becomes the maximum in both the X- and Y-axis directions when the binarized image data are processed for histogram formation, respectively. These photographs indicate that when the focal point is changed in the over focusing direction, the coordinates at which the histogram frequency becomes the maximum in both the directions is shifted in the positive X-axis direction. Therefore, this indicates that the over focusing of the lens alignment in the positive X-axis direction must be corrected in the negative X-axis direction. FIGS. 4(c) and (f) show the corrected result, respectively. These photographs indicate that even if the focal point is changed, the image will not shift, with the result that it is possible to confirm that the lens alignment can be executed normally.

As described above, in the apparatus and the method of the present invention, it is possible to control the electron beam automatically without shifting the filament image or the secondary electron image.

What is claimed is:

1. A gun alignment control apparatus for an scanning electron microscope, comprising:

first control means for controllably setting either one of a condenser lens and a scan coil to first and second conditions, respectively;

image inputting means for inputting first and second filament images obtained under the first and second conditions, respectively;

image processing means for processing the first and second filament images to obtain first and second binarized images, respectively;

histogram processing means for processing the first and second binarized images to obtain first and second histograms, respectively;

coordinate detecting means for detecting first and second coordinates at which the first and second histograms become maximum in frequency, respectively; and gun alignment coil control means for controlling exciting current for a gun alignment coil so that the distance between the two coordinates lies within an allowable range.

2. The gun alignment control apparatus for an scanning electron microscope of claim 1, wherein said histogram processing means processes the first and second binarized images in both X- and Y-axis directions to obtain a first X-axis direction histogram and a first Y-axis direction histogram on the basis of the first binarized image and a second X-axis direction histogram and a second Y-axis direction histogram on the basis of the second binarized image; and said coordinate detecting means detects a first X-axis direction coordinate value and a first Y-axis direction coordinate value at which the first X- and Y-axis direction histograms are maximum in frequency, respectively, and a second X-axis direction coordinate value and a second Y-axis direction coordinate value at which the second X- and Y-axis direction histograms are maximum in frequency, respectively.

3. The gun alignment control apparatus for an scanning electron microscope of claim 1, wherein said first control means sets the two condenser lens conditions by changing reduction ratio of the condenser lens, for gun alignment tilt correction.

4. The gun alignment control apparatus for an scanning electron microscope of claim 2, wherein said first control means sets the two condenser lens conditions by changing reduction ratio of the condenser lens, for gun alignment tilt correction.

5. The gun alignment control apparatus for an scanning electron microscope of claim 1, wherein said first control means sets the two conditions by changing magnification of the scan coil, for gun alignment shift correction.

6. The gun alignment control apparatus for an scanning electron microscope of claim 2, wherein said first control means sets the two conditions by changing magnification of the scan coil, for gun alignment shift correction.

7. The gun alignment control apparatus for an scanning electron microscope of claim 3, wherein said gun alignment coil control means controls exciting current for the gun alignment coil so that the distance between the two coordinates is shorter than a distance expressed by a predetermined pixel number.

8. The gun alignment control apparatus for an scanning electron microscope of claim 4, wherein said gun alignment coil control means controls exciting current for the gun alignment coil so that the distance between the two coordinates is shorter than a distance expressed by a predetermined pixel number.

9. The gun alignment control apparatus for an scanning electron microscope of claim 7, which further comprises operation mode setting means for setting operation mode to a filament image mode prior to control operation.

10. The gun alignment control apparatus for an scanning electron microscope of claim 8, which further comprises operation mode setting means for setting operation mode to a filament image mode prior to control operation.

11. An objective lens alignment control apparatus for an scanning electron microscope, comprising:
objective lens control means for controllably setting a objective lens to first and second conditions, respectively;
image inputting means for inputting first and second secondary electron images obtained under the first and second conditions, respectively;
image processing means for processing the first and second secondary electron images to obtain first and second binarized images, respectively;
histogram processing means for processing the first and second binarized images to obtain first and second histograms, respectively;
coordinate detecting means for detecting first and second coordinates at which the first and second histograms become maximum in frequency, respectively; and
objective lens alignment coil control means for controlling exciting current for a objective lens alignment coil so that the distance between the two coordinates lies within an allowable range.

12. The lens alignment control apparatus for an scanning electron microscope of claim 11, wherein said histogram processing means processes the first and second binarized images in both X- and Y-axis directions to obtain a first X-axis direction histogram and a first Y-axis direction histogram on the basis of the first binarized image and a second X-axis direction histogram and a second Y-axis direction histogram on the basis of the second binarized image; and said coordinate detecting means detects a first X-axis direction coordinate value and a first Y-axis direction coordinate value at which the first X- and Y-axis direction histograms are maximum in frequency, respectively, and a second X-axis direction coordinate value and a second Y-axis direction coordinate value at which the second X- and Y-axis direction histograms are maximum in frequency, respectively.

13. The lens alignment control apparatus for an scanning electron microscope of claim 11, wherein said objective lens control means sets the two objective lens conditions by changing focus condition of the objective lens to in-focus and out-of-focus conditions.

14. The lens alignment control apparatus for an scanning electron microscope of claim 12, wherein said objective lens control means sets the two objective lens conditions by changing focus condition of the objective lens to in -focus and out-of-focus conditions.

15. The lens alignment control apparatus for an scanning electron microscope of claim 11, wherein said objective lens alignment coil control means controls exciting current for the objective lens alignment coil so that the distance between the two coordinates is shorter than a distance expressed by a predetermined pixel number.

16. The lens alignment control apparatus for an scanning electron microscope of claim 15, which further comprises operation mode setting means for setting operation mode to a secondary electron image mode prior to control operation.

17. A gun alignment control for an scanning electron microscope, comprising the steps of:
controllably setting either one of a condenser lens and a scan coil to first and second conditions, respectively;
inputting first and second filament images obtained under the first and second conditions, respectively;
processing the first and second filament images to obtain first and second binarized images, respectively;
processing the first and second binarized images to obtain first and second histograms, respectively;
detecting first and second coordinates at which the first and second histograms become maximum in frequency, respectively; and
controlling exciting current for a gun alignment coil so that the distance between the two coordinates lies within an allowable range.

18. The gun alignment control method for an scanning electron microscope of claim 17, wherein the step of processing histogram comprises the step of processing the first and second binarized images in both X- and Y-axis directions to obtain a first X-axis direction histogram and a first Y-axis direction histogram on the basis of the first binarized image and a second X-axis direction histogram and a second Y-axis direction histogram on the basis of the second binarized image; and the step of detecting coordinates comprises the step of detecting a first X-axis direction coordinate value and a first Y-axis direction coordinate value at which the first X- and Y-axis direction histograms are maximum in frequency, respectively, and a second X-axis direction coordinate value and a second Y-axis direction coordinate value at which the second X- and Y-axis direction histograms are maximum in frequency, respectively.

19. The gun alignment control method for an scanning electron microscope of claim 17, wherein the step of setting the condenser lens comprises the step of setting the two condenser lens conditions by changing reduction ratio of the condenser lens, for gun alignment tilt correction.

20. The gun alignment control method for an scanning electron microscope of claim 18, wherein the step of setting the condenser lens comprises the step of setting the two condenser lens conditions by changing reduction ratio of the condenser lens, for gun alignment tilt correction.

21. The gun alignment control method for an scanning electron microscope of claim 17, wherein the step of setting the scan coil comprises the step of setting the two scan coil conditions by changing magnification of the scan coil, for gun alignment shift correction.

22. The gun alignment control method for an scanning electron microscope of claim 18, wherein the step of setting the scan coil comprises the step of setting the two scan coil conditions by changing magnification of the scan coil, for gun alignment shift correction.

23. The gun alignment control method for an scanning electron microscope of claim 17, wherein the step of controlling exciting current comprises the step of controlling exciting current for the gun alignment coil so that the distance between the two coordinates is shorter than a distance expressed by a predetermined pixel number.

24. The gun alignment control method for an scanning electron microscope of claim 18, wherein the step of controlling exciting current comprises the step of controlling exciting current for the gun alignment coil so that the distance between the two coordinates is shorter than a distance expressed by a predetermined pixel number.

25. The gun alignment control method for an scanning electron microscope of claim 23, which further comprises the step of setting operation mode to a filament image mode prior to control operation.

26. The gun alignment control method for an scanning electron microscope of claim 24, which further comprises the step of setting operation mode to a filament image mode prior to control operation.

27. An objective lens alignment control method for an scanning electron microscope, comprising the steps of:
controllably setting an objective lens to first and second conditions, respectively;
inputting first and second secondary electron images obtained under the first and second conditions, respectively;
processing the first and second secondary electron images to obtain first and second binarized images, respectively;
processing the first and second binarized images to obtain first and second histograms, respectively;
detecting first and second coordinates at which the first and second histograms become maximum in frequency, respectively; and
controlling exciting current for a lens alignment coil so that the distance between the two coordinates lies within an allowable range.

28. The objective lens alignment control method for an scanning electron microscope of claim 27, wherein the step of processing histogram comprises the step of processing the first and second binarized images in both X- and Y-axis directions to obtain a first X-axis direction histogram and a first Y-axis direction histogram on the basis of the first binarized image and a second X-axis direction histogram and a second Y-axis direction histogram on the basis of the second binarized image; and the step of detecting coordinates comprises the step of detecting a first X-axis direction coordinate value and a first Y-axis direction coordinate value at which the first X- and Y-axis direction histograms are maximum in frequency, respectively, and a second X-axis direction coordinate value and a second Y-axis direction coordinate value at which the second X- and Y-axis direction histograms are maximum in frequency, respectively.

29. The objective lens alignment control method for an scanning electron microscope of claim 27, wherein the step of setting the objective lens comprises the step of setting the two objective lens conditions by changing focus condition of the objective lens to in-focus and out-of-focus condition.

30. The objective lens alignment control method for an scanning electron microscope of claim 28, wherein the step of setting the objective lens comprises the step of setting the two objective lens conditions by changing focus condition of the objective lens to in-focus and out-of-focus condition.

31. The objective lens alignment control method for an scanning electron microscope of claim 29, wherein the step of controlling exciting current comprises the step of controlling exciting current for the objective lens alignment coil so that the distance between the two coordinates is shorter than a distance expressed by a predetermined pixel number.

32. The objective lens alignment control method for an scanning electron microscope of claim 31, which further comprises the step of setting operation mode to a secondary electron image mode prior to control operation.

* * * * *